(12) United States Patent
Hoogzaad et al.

(10) Patent No.: US 12,316,291 B2
(45) Date of Patent: May 27, 2025

(54) ATTENUATOR ARRANGEMENT

(71) Applicant: NXP B.V., Eindhoven (NL)

(72) Inventors: Gian Hoogzaad, Mook (NL); Olivier Crand, Parfouru sur Odon (FR); Robert Victor Buytenhuijs, Wijchen (NL); Serge Bardy, Caen (FR)

(73) Assignee: NXP B.V., Eindhoven (NL)

( * ) Notice: Subject to any disclaimer, the term of this patent is extended or adjusted under 35 U.S.C. 154(b) by 592 days.

(21) Appl. No.: 17/450,370

(22) Filed: Oct. 8, 2021

(65) Prior Publication Data
US 2022/0123703 A1   Apr. 21, 2022

(30) Foreign Application Priority Data

Oct. 16, 2020   (EP) ..................................... 20306228

(51) Int. Cl.
*H03G 3/30*     (2006.01)
*H03G 1/00*     (2006.01)
*H03H 11/24*    (2006.01)

(52) U.S. Cl.
CPC ........... *H03G 3/3042* (2013.01); *H03G 1/007* (2013.01); *H03G 1/0088* (2013.01); *H03H 11/245* (2013.01); *H03G 2201/106* (2013.01)

(58) Field of Classification Search
CPC .... H03G 3/3042; H03G 1/007; H03G 1/0088; H03G 1/0023; H03G 2201/106;

(Continued)

(56) References Cited

U.S. PATENT DOCUMENTS

| | | | |
|---|---|---|---|
| 4,525,688 A * | 6/1985 | Murphy | H03H 7/24 333/81 R |
| 6,046,640 A * | 4/2000 | Brunner | H03G 1/0023 330/311 |

(Continued)

FOREIGN PATENT DOCUMENTS

| | | |
|---|---|---|
| EP | 2110947 A1 | 10/2009 |
| JP | 2006157385 A | 6/2006 |

(Continued)

OTHER PUBLICATIONS

Cowles, John, and Barrie Gilbert. "Accurate gain/phase measurement at radio frequencies up to 2.5 GHz." Analog Dialogue 35, No. 5 (2001): 1-4 (Year: 2001).*

(Continued)

*Primary Examiner* — Douglas Kay

(57) ABSTRACT

An attenuator arrangement comprising at least a first attenuation path configured to couple between a signal processing chain, SPC, and a measurement apparatus; said SPC comprising a first and second SPC terminal, said SPC configured to apply one or both of a gain and phase change on a signal passed between the SPC terminals; said measurement apparatus configured to measure one or both of the gain and the phase change applied by SPC by coupling to and receiving signals from said SPC terminals; wherein one of said first SPC terminal and said second SPC terminal is coupled to the measurement apparatus through said first attenuation path; and wherein the at least first attenuation path of the attenuator arrangement is configured to provide, selectively, for attenuation of the signal to the measurement apparatus to make the signal power of the signals from said SPC terminals more equal.

13 Claims, 4 Drawing Sheets

(58) Field of Classification Search
CPC ........ H03H 11/245; H03H 7/25; H03H 11/24; H03F 2200/451; H03F 3/19; H03F 3/211; H03F 3/45089
See application file for complete search history.

(56) References Cited

U.S. PATENT DOCUMENTS

| | | | |
|---|---|---|---|
| 6,212,369 B1* | 4/2001 | Avasarala | H03D 7/1425 |
| | | | 327/356 |
| 8,433,263 B2 | 4/2013 | Pratt et al. | |
| 10,193,531 B2 | 1/2019 | Shrivastava | |
| 2002/0128007 A1* | 9/2002 | Miyatani | H04B 1/7107 |
| | | | 455/67.11 |
| 2002/0140502 A1 | 10/2002 | Nakatani et al. | |
| 2003/0179040 A1 | 9/2003 | Kossor | |
| 2005/0157626 A1* | 7/2005 | Lin | G11B 20/10314 |
| | | | 369/124.11 |
| 2008/0129384 A1 | 6/2008 | Dobashi et al. | |
| 2018/0053997 A1 | 2/2018 | Noto et al. | |
| 2018/0054178 A1* | 2/2018 | Bergsma | H03H 7/07 |

FOREIGN PATENT DOCUMENTS

| | | | |
|---|---|---|---|
| JP | 2013236410 A | * | 11/2013 |
| JP | 2013236410 A1 | | 11/2013 |

OTHER PUBLICATIONS

Leonard, Francis. "Generic embedded sensor development: high-speed analogue preconditioning and data acquisition systems." PhD diss., Dublin City University, 2006 (Year: 2006).*

* cited by examiner

ATTENUATOR ARRANGEMENT

CROSS-REFERENCE TO RELATED APPLICATIONS

This application claims the priority under 35 U.S.C. § 119 of European Patent application no. 20306228.6, filed on 16 Oct. 2020, the contents of which are incorporated by reference herein.

FIELD

The present disclosure relates to an attenuator arrangement for selectively attenuating a signal. The present disclosure also relates to said attenuator arrangement in combination with said measurement apparatus and said transceiver. The attenuator arrangement may be used in the field of testing a transceiver or other RF signal processing circuit. In particular, the present disclosure relates to an attenuator arrangement for selectively attenuating a signal that is output from a transceiver such that an attenuated version of said signal can be provided to said measurement apparatus for determining a phase shift and/or gain introduced by the transceiver.

BACKGROUND

In RF signal processing, a signal processing chain may operate as a receiver (RX) and/or a transmitter (TX) that operates at mm wave frequencies. The signal processing chain can be configured to change a signal's amplitude and may therefore be considered to include one or more amplifiers. Furthermore, a signal processing chain may be configured for changing a signal's phase and may therefore be considered to include one or more of a "Phase Rotator", "Phase Shifter" or "Delay circuit". The signal processing chain may be formed as part of an integrated circuit known generally as a Radio Frequency Integrated Circuits (RFIC). At mm wave frequencies, such as 10-300 GHz, e.g. in 5G communication products, costs for testing the RX and TX arrangements can be high. Measurement apparatus can be designed, as part of the RFIC, that tests the signal processing chain.

The gain and/or phase change applied by a signal processing chain can be determined by using a measurement apparatus such as a gain/phase detector. However, it is difficult and costly to ensure that the gain/phase detectors used are more accurate than the signal processing chain they are being used to measure.

SUMMARY

According to a first aspect of the present disclosure there is provided an attenuator arrangement comprising at least a first attenuation path, said attenuator arrangement configured to couple between a signal processing chain and a measurement apparatus;
  said signal processing chain, SPC, comprising a first SPC terminal and a second SPC terminal, said signal processing chain configured to apply one or both of a gain and phase change on a signal passed between the first SPC and second SPC terminals;
  said measurement apparatus configured to measure one or both of the gain and the phase change applied by said signal processing chain by coupling to and receiving signals from said first SPC terminal and said second SPC terminal;
  wherein one of said first SPC terminal and said second SPC terminal is coupled to the measurement apparatus through said first attenuation path; and
  wherein the first attenuation path of the attenuator arrangement is configured to provide, selectively, for attenuation of the signal from said one of the first SPC terminal and the second SPC terminal to the measurement apparatus, the attenuator arrangement configured to provide said selective attenuation to make the signal power of the signal from said one of the first SPC terminal and the second SPC terminal more equal to the signal power of the signal from the other of the first SPC terminal and the second SPC terminal.

In one or more embodiments, the attenuator arrangement comprises a second attenuation path, wherein the first attenuation path provides for selective attenuation of the signal from the first SPC terminal to the measurement apparatus and the second attenuation path provides for selective attenuation of the signal from the second SPC terminal to the measurement apparatus, wherein the selective attenuation provided by each of the first attenuation path and the second attenuation path is based on the relative signal power between the signals from the first SPC terminal and a second SPC terminal and said selective attenuation is configured to make the signal power of the signal from first SPC terminal more equal to the signal power of the signal from the second SPC terminal.

In one or more embodiments, one or both of said first attenuation path and second attenuation path comprises:
  a differential input (Vin) comprising a first input terminal and a second input terminal for receiving the signal from the one of the first SPC terminal and the second SPC terminal, the signal comprising a differential input signal;
  a differential output (Vout) comprising a first output terminal and a second output terminal for outputting a differential output signal that has been selectively attenuated for providing to the measurement apparatus;
  a switching circuit comprising at least a first cascode arrangement, a second cascode arrangement, a third cascode arrangement and a fourth cascode arrangement,
  wherein the first and second cascode arrangements are configured to pass a first signal from the first input terminal to one of a first cascode output terminal and a second cascode output terminal and block the first signal to the other of the first cascode output terminal and the second cascode output terminal based on a first selector signal and a second selector signal, and
  wherein the third and fourth cascode arrangements are configured to pass a second signal from the second input terminal to one of a third cascode output terminal and a fourth cascode output terminal and block the second signal to the other of the third cascode output terminal and the fourth cascode output terminal based on a third selector signal and a fourth selector signal; and
  a controller configured to generate at least the first selector signal, the second selector signal, the third selector signal and the fourth selector signal, and
  an attenuator ladder comprising at least one first balanced pi-section resistive attenuator pad arrangement having a first and a second pad input terminal and a first and a second pad output terminal, wherein the first and second pad output terminals are coupled to the first output terminal and the second output terminal of the differential output (Vout) respectively, and wherein the first cascode output terminal and the third cascode output terminal are coupled to the first pad input terminal and second pad input terminal respectively such that said at least one first balanced pi-section resistive attenuator pad arrangement provides for attenuation of the first signal and the second signal to provide the differential output signal; and wherein the second cascode output terminal and the fourth cascode output terminal are coupled to the first pad output terminal and second pad output terminal respectively.

According to a further aspect of the present disclosure there is provided an attenuator arrangement for selectively attenuating a differential signal comprising at least a first attenuation path, said first attenuation path comprising:

a differential input (Vin) comprising a first input terminal and a second input terminal for receiving a differential input signal;

a differential output (Vout) comprising a first output terminal and a second output terminal for outputting a differential output signal that has been selectively attenuated;

a switching circuit comprising at least a first cascode arrangement, a second cascode arrangement, a third cascode arrangement and a fourth cascode arrangement, wherein the first and second cascode arrangements are configured to pass a first signal from the first input terminal to one of a first cascode output terminal and a second cascode output terminal and block the first signal to the other of the first cascode output terminal and the second cascode output terminal based on a first selector signal and a second selector signal, and wherein the third and fourth cascode arrangements are configured to pass a second signal from the second input terminal to one of a third cascode output terminal and a fourth cascode output terminal and block the second signal to the other of the third cascode output terminal and the fourth cascode output terminal based on a third selector signal and a fourth selector signal; and a controller configured to generate at least the first selector signal, the second selector signal, the third selector signal and the fourth selector signal, and an attenuator ladder comprising at least one first balanced pi-section resistive attenuator pad arrangement having a first and second pad input terminal and a first and second pad output terminal, wherein the first and second pad output terminals are coupled to the first output terminal and the second output terminal of the differential output (Vout) respectively, and wherein the first cascode output terminal and the third cascode output terminal are coupled to the first pad input terminal and second pad input terminal respectively such that said at least one first balanced pi-section resistive attenuator pad arrangement provides for attenuation of the first signal and the second signal to provide the differential output signal; and wherein the second cascode output terminal and the fourth cascode output terminal are coupled to the first pad output terminal and second pad output terminal respectively.

In one or more examples, the attenuator ladder may comprise, instead of said balanced pi-section resistive attenuator pad arrangement, at least one first T-section, or bridged-T section resistor arrangement having said first and second pad input terminal and a first and second pad output terminal.

In one or more embodiments, the signals from the first SPC terminal and the second SPC terminal may comprise single ended signals. In other examples, they may comprise differential signals. In other examples, they may comprise a single ended signal along with a DC reference signal. Accordingly, the first input terminal and the second input terminal may be configured to receive a single ended signal and its DC reference respectively.

In one or more embodiments, the first balanced pi-section resistive attenuator pad arrangement comprises a first resistor having first and second terminals configured to be in series with the first pad input terminal and the first pad output terminal, a second resistor having first and second terminals configured to be in series with the second pad input terminal and the second pad output terminal, a third resistor coupled in parallel between corresponding first terminals of the first resistor and the second resistor and a fourth resistor coupled in parallel between corresponding second terminals of the first resistor and the second resistor.

In one or more embodiments, the third resistor comprises a pair of resistors in series with a node therebetween and the fourth resistor comprises a pair of resistors in series with a node therebetween, wherein the nodes between each pair of resistors are configured to be coupled to a supply voltage (vcc).

In one or more embodiments, the first cascode arrangement comprises a first cascode input terminal configured to receive a first signal from the first input terminal, a first cascode output terminal and a first selector terminal, wherein the first cascode arrangement is configured to control the passage of the first signal to the first cascode output terminal based on a first selector signal received from the controller at the first selector terminal, and the second cascode arrangement comprises a second cascode input terminal configured to receive the first signal from the first input terminal, a second cascode output terminal and a second selector terminal, wherein the second cascode arrangement is configured to control the passage of the first signal to the second cascode output terminal based on a second selector signal received from the controller at the second selector terminal;

the third cascode arrangement comprises a third cascode input terminal configured to receive a second signal from the second input terminal, a third cascode output terminal and a third selector terminal, wherein the third cascode arrangement is configured to control the passage of the second signal to the third cascode output terminal based on a third selector signal received from the controller at the third selector terminal, and the fourth cascode arrangement comprises a fourth cascode input terminal configured to receive the second signal from the second input terminal, a fourth cascode output terminal and a fourth selector terminal, wherein the fourth cascode arrangement is configured to control the passage of the second signal to the fourth cascode output terminal based on a fourth selector signal received from the controller at the fourth selector terminal.

In one or more embodiments, the first cascode arrangement comprises an upper transistor in series with a lower transistor and wherein a collector terminal of said upper transistor provides the first cascode output terminal, an emitter terminal of the upper transistor is coupled to a collector terminal of the lower transistor, a base terminal of said lower transistor is configured to receive the first signal; and the second cascode arrangement comprises an upper transistor in series with a lower transistor and wherein a collector terminal of said upper transistor provides the second cascode output terminal, an emitter terminal of the upper transistor is coupled to a collector terminal of the lower transistor, a base terminal of said lower transistor is configured to receive the first signal, the third cascode arrangement comprises an upper transistor in series with a lower transistor and wherein a collector terminal of said upper transistor provides the third cascode output terminal, an emitter terminal of the upper transistor is coupled to a collector terminal of the lower transistor, a base terminal of said lower transistor is configured to receive the second signal, the fourth cascode arrangement comprises an upper transistor in series with a lower transistor and wherein a collector terminal of said upper transistor provides the fourth cascode output terminal, an emitter terminal of the upper transistor is coupled to a collector terminal of the lower transistor, a base terminal of said lower transistor is configured to receive the second signal.

In one or more embodiments, the first selector signal equals the third selector signal and therefore the controller is configured to apply the same selector voltage to the base terminal of the upper transistor of the first and third cascode arrangements to provide for either of said passing or blocking of the first and second signals and wherein the second selector signal equals the fourth selector signal and therefore the controller is configured to apply the same selector voltage to the base terminal of the upper transistor of the second and fourth cascode arrangements to provide for either of said passing or blocking of the first and second signal.

In one or more embodiments, the first cascode arrangement comprises a first upper transistor coupled in series with a first shared lower transistor and the second cascode arrangement comprises a second upper transistor coupled in series with said first shared lower transistor, wherein a collector terminal of said first upper transistor provides the first cascode output terminal and a collector terminal of said second upper transistor provides the second cascode output terminal, an emitter terminal of the first and second upper transistor is coupled to a collector terminal of the first shared lower transistor, and a base terminal of said first shared lower transistor is configured to receive the first signal, and wherein, the third cascode arrangement comprises a third upper transistor coupled in series with a second shared lower transistor and the fourth cascode arrangement comprises a fourth upper transistor coupled in series with said second shared lower transistor, wherein a collector terminal of said third upper transistor provides the third cascode output terminal and a collector terminal of said fourth upper transistor provides the fourth cascode output terminal, an emitter terminal of the third and fourth upper transistor is coupled to a collector terminal of the second shared lower transistor, and a base terminal of said second shared lower transistor is configured to receive the second signal.

In one or more embodiments, the attenuator arrangement comprises:
a fifth cascode arrangement comprising a fifth cascode input terminal configured to receive a first signal from the first input terminal, a fifth cascode output terminal and a fifth selector terminal, wherein the fifth cascode arrangement is configured to control the passage of the first signal to the fifth cascode output terminal based on a fifth selector signal received from the control circuit at the fifth selector terminal, and a sixth cascode arrangement comprising a sixth cascode input terminal configured to receive the second signal from the second input terminal, a sixth cascode output terminal and a sixth selector terminal, wherein the sixth cascode arrangement is configured to control the passage of the second signal to the sixth cascode output terminal based on a sixth selector signal received from the control circuit at the sixth selector terminal.

In one or more embodiments, an emitter terminal of the lower transistor of both the first cascode arrangement and the third cascode arrangement are coupled to a drain terminal of a first MOSFET for controlling the passing and blocking action of the first and third cascode arrangements, wherein the source terminal of said first MOSFET is configured to be coupled to a reference voltage, and the first selector signal and the third selector signal comprise the same first selector signal and the gate terminal of said first MOSFET is configured to receive said same first selector signal, and wherein an emitter terminal of the lower transistor of both the second cascode arrangement and the fourth cascode arrangement are coupled to a drain terminal of a second MOSFET for controlling the passing and blocking action of the second and fourth cascode arrangements, wherein the source terminal of said second MOSFET is configured to be coupled to a reference voltage, and the second selector signal and the fourth selector signal comprise the same second selector signal and the gate terminal of said second MOSFET is configured to receive said same second selector signal.

In one or more embodiments, a first resistor is coupled between the drain terminal of said first MOSFET and the emitter terminal of said first cascode arrangement and third cascode arrangement, and wherein a second resistor is coupled between the drain terminal of said second MOSFET and the emitter terminal of said second cascode arrangement and fourth cascode arrangement.

In one or more embodiments, the base terminal of the upper transistor of the first to fourth cascode arrangements are configured to be biased by a common bias voltage (Vcasc).

In one or more embodiments, the controller is configured to output a selectable selector voltage, the selector voltage selectable from one of, a first selector voltage level configured to bias the respective one of the first to fourth cascode arrangements to enable a path to the cascode output terminal, or a second selector voltage level configured to bias the respective one of the first to fourth cascode arrangements to block a path to the cascode the output terminal.

In one or more embodiments, the attenuator arrangement comprises a second attenuation path. In one or more examples, said second attenuation path comprises:
a differential input (Vin) of the second attenuation path comprising a first input terminal and a second input terminal for receiving a second differential input signal;
a differential output (Vout) of the second attenuation path comprising a first output terminal and a second output terminal for outputting a second differential output signal that has been selectively attenuated;
a switching circuit of the second attenuation path comprising at least a first cascode arrangement, a second cascode arrangement, a third cascode arrangement and a fourth cascode arrangement,
wherein the first and second cascode arrangements are configured to pass a first signal from the first input terminal to one of a first cascode output terminal and a second cascode output terminal and block the first signal to the other of the first cascode output terminal and the second cascode output terminal based on a first selector signal and a second selector signal, and wherein the third and fourth cascode arrangements are configured to pass a second signal from the second input terminal to one of a third cascode output terminal and a fourth cascode output terminal and block the second signal to the other of the third cascode output terminal and the fourth cascode output terminal based on a third selector signal and a fourth selector signal; and a controller of the second attenuation path configured to generate at least the first selector signal, the second selector signal, the third selector signal and the fourth selector signal, and an attenuator ladder of the second attenuation path comprising at least one first balanced pi-section resistive attenuator pad arrangement having a first and second pad input terminal and a first and second pad output terminal, wherein the first and second pad output terminals are coupled to the first output terminal and the second output terminal of the differential output of the second attenuation path (Vout) respectively, and wherein the first cascode output terminal and the third cascode output terminal are coupled to the first pad input terminal and second pad input terminal respectively such that said at least one first balanced pi-section resistive attenuator pad arrangement provides for attenuation of the first signal and the second signal to provide the second differential output signal; and wherein the second cascode output terminal and the fourth cascode output terminal are coupled to the first pad output terminal and second pad output terminal of the second attenuation path respectively.

According to a second aspect of the present disclosure there is provided a device comprising said signal processing chain, said measurement apparatus and the attenuator arrangement of the first or further aspect. In one or more examples, the signal processing chain comprises a transmitter, receiver or transceiver of a 5G telecommunication device.

In one or more embodiments, said measurement made by the measurement apparatus is configured to account for the attenuation selectively provided by one or both of said first attenuation path and said second attenuation path

BRIEF DESCRIPTION OF THE DRAWINGS

One or more embodiments will now be described by way of example only with reference to the accompanying drawings in which.

DETAILED DESCRIPTION

Figure 1:
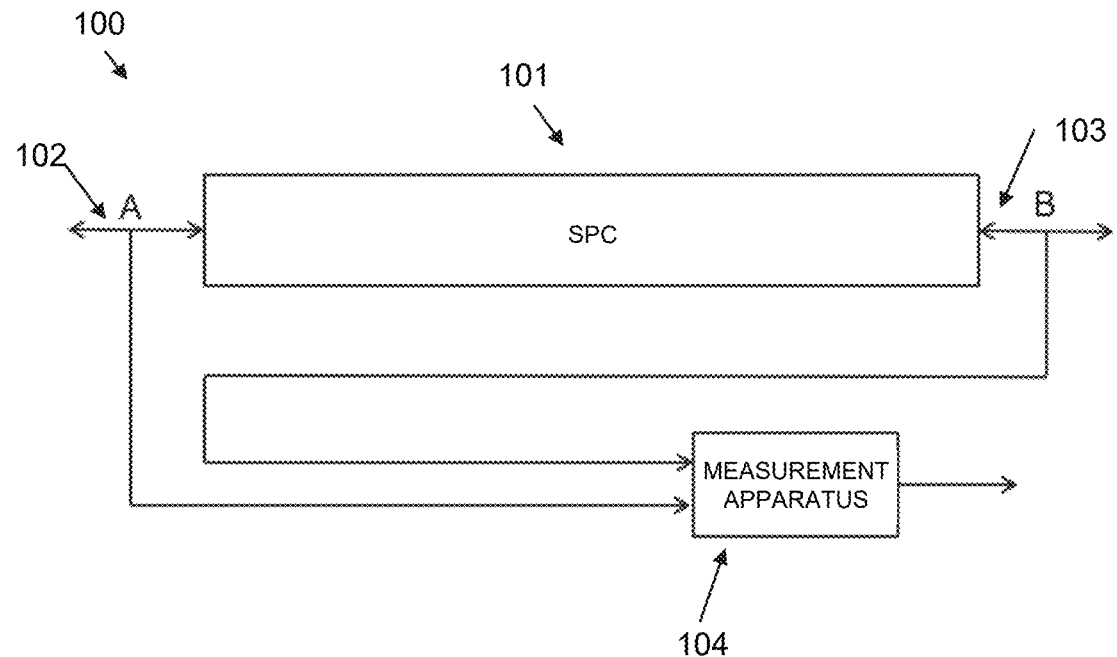
FIG. 1 illustrates a signal processing chain, such as a transceiver, having a measurement apparatus, such as a gain and/or phase detector coupled therewith, the measurement apparatus configured to measure or "test" the gain and/or phase change applied by the signal processing chain between first and second terminals of the signal processing chain.

FIG. 1 illustrates a measurement apparatus 104 such as a gain/phase detector which can be used to measure the effect a signal processing chain 101 (SPC) or "circuit under test" has on an input signal at 102, which may be a single ended or differential input signal. The measurement apparatus 104 in FIG. 1 may be a gain detector, a phase detector or any other test circuit for determining any other parameter of the signal input thereto. The signal processing chain (SPC) may comprise linear circuits commonly used in RFICs, such as amplifiers, phase rotators, filters, attenuators, couplers, etc. The signal processing chain may comprise a transmitter, a receiver or a transceiver in which a signal may pass in either direction and so the direction of the signal may be from the first, SPC, terminal 102 to the second, SPC, terminal 103 in one of the receive or transmit mode and can be from the second, SPC, terminal 103 to the first, SPC, terminal 102 in the other of the receive or transmit modes respectively. It will be appreciated that the first signal and second signal may be single ended or differential signals. For the examples shown in the figures the signals are assumed to be differential signals.

Thus, the signal processing chain may receive an input signal at a first terminal 102 and provide an output signal at a second terminal 103 (or vice-versa). The output signal, by virtue of the functionality of the signal processing chain 101, may differ from input signal in terms of one or both of amplitude or phase by way of the gain applied by the signal processing chain or the degree of phase rotation applied by the signal processing chain. In other examples, the signal processing chain may be configured not to apply a gain and/or phase rotation to the input signal and imperfections in the fabrication processes may lead such a gain and/or phase rotation to occur in practice. The measurement apparatus 104 may be implemented as a built-in-self-test (BIST) on the same integrated circuit (IC) as the circuit under test 101. This "Built-In Self-Test" (BIST) measurement apparatus can be implemented as a gain and/or phase detector which aids in testing the circuit under test of the IC or, wherein the input signal is alternating, i.e. an RFIC.

The signal provided to the signal processing chain 101 may substantially differ in amplitude relative to the signal output from the signal processing chain 101. Thus, when the signal processing chain 101 operates as a transmitter, the output at terminal 103 may have a much greater amplitude than the input at terminal 102. When the transceiver 101 operates as a receiver the output at terminal 102 may have a much greater amplitude than the input at terminal 103. The measurement apparatus 104 may be required to have a large dynamic range to be able to accurately determine the gain and/or phase changes introduced by the transceiver 101. The accuracy of the measurement apparatus 104 may be detrimentally affected by the need for it to have a large dynamic range. For example, the presence of high amplitude signals and low amplitude signals within the measurement apparatus 104 can lead to cross-talk within the measurement apparatus 104, which may impact on accuracy.

There is a need for a more accurate measurement apparatus 104 for implementing accurate beam steering systems such as for example in multi-channel 5G mm wave systems. An accurate built-in self-test arrangement for these systems may provide a cheaper and more effective system compared to external testing regimes. The signal processing chain 101 may comprise various kinds of amplifiers (power amplifiers, low noise amplifiers, variable gain amplifiers etc), vector modulators, attenuators and filters. RF signal processing stages are usually hampered by gain and phase spread, such as 12 dB and 100 degrees. Most of this spread comes from IC process variations, due to the signal frequencies of interest being close to the circuits' device limitations. This is particularly prevalent at the 5G mm wave frequencies. Accurate beam steering requires low sidelobe levels of for example −20 dB. Without a mechanism to test the output of the circuit under test in-situ, each system would need to be tested individually leading to significant time and financial costs.

The output of a measurement apparatus 104 such as a phase/gain detector circuit can be improved by using an attenuator arrangement 200 comprising an attenuation path 205 (see FIG. 2) to attenuate, selectively, the signals provided to the measurement apparatus 104 so that the amplitude of the signals provided thereto are more equal in amplitude. This provides a means to improve the accuracy and range of the measurement apparatus by selectively attenuating the signal having the greater amplitude so as to make the amplitude of the signals for receipt by the measurement apparatus 104 more equal. Alternatively, in an example not forming part of the present disclosure, instead of attenuating the signal with the greater amplitude, the signal with the smaller amplitude can be amplified. However, such an amplifier would typically be hampered by the same issues as the amplifiers in the signal processing chain 101. It has been found that attenuators disclosed herein may be built with more accuracy, dynamic range and bandwidth, hence the use of an attenuator before the measurement apparatus 104.

Figure 2:
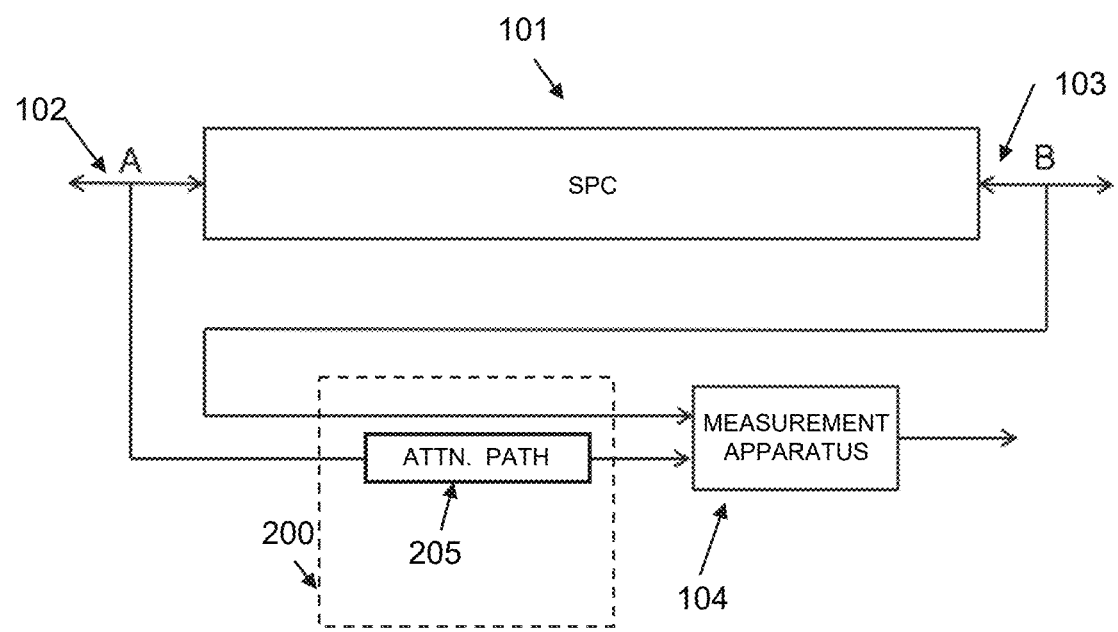
FIG. 2 illustrates an example embodiment in which an attenuator arrangement having a first attenuation path is provided in one of the differential paths between the signal processing chain and the measurement apparatus for selectively attenuating the input signal to, or output signal from, the signal processing chain.

FIG. 2 shows the use of an attenuator arrangement 200 having a single attenuation path 205 coupled between one (i.e. either of) the terminals 102, 103 of the circuit under test and the measurement apparatus 104. The other terminal, that perhaps does not require attenuation, is coupled to the measurement apparatus 104 directly, i.e. without passing through an attenuation path of the attenuator 200.

Figure 3:
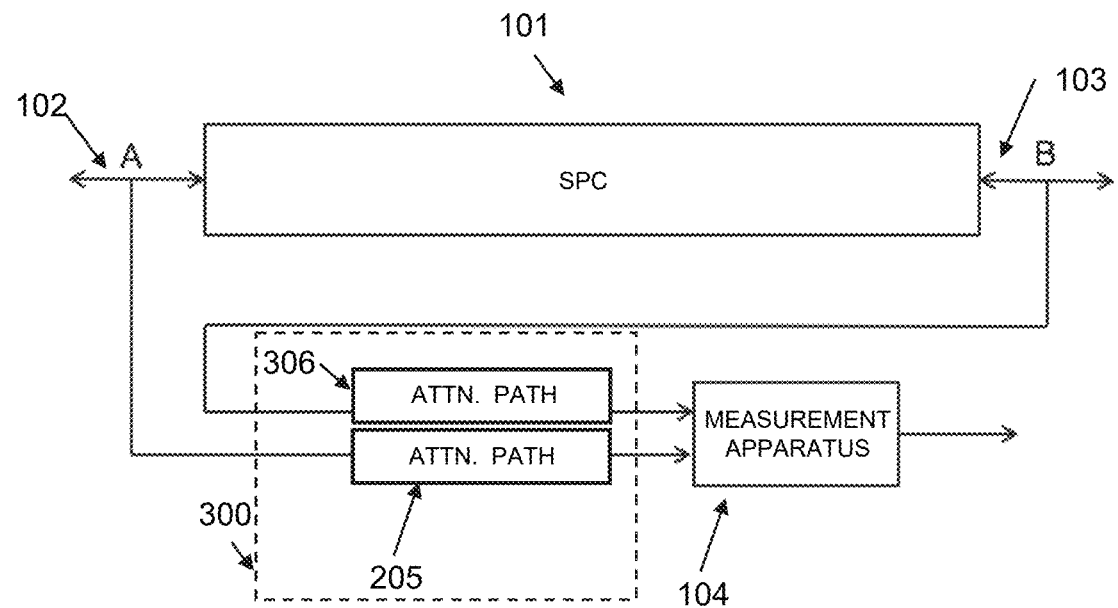
FIG. 3 illustrates an example embodiment in which an attenuator arrangement is provided having a first attenuation path between the signal processing chain and the measurement apparatus for selectively attenuating the input signal to, or output signal from, the signal processing chain and a second attenuation path between the signal processing chain and the measurement apparatus for selectively attenuating the other of the input signal to, or output signal from, the signal processing chain.

FIG. 3 shows the use of an attenuator arrangement 300 having a first attenuation path 205 coupled between the first terminal 102 and the measurement apparatus 104 and a second attenuation path 306 coupled between the second terminal 103 and the measurement apparatus 104. In either the example embodiment of FIG. 2 or 3, the attenuator path 205, 306 may be selectively activated to attenuate or not attenuate (or attenuate to a different level) in order to make the signals provided to the measurement apparatus 104 more equal in amplitude or power. The amount of attenuation provided may be known and therefore the measurement apparatus 104 or wider system can take account of the attenuation applied by the attenuator arrangement when comparing the signals from the terminals 102 and 103 to determine the gain or phase shift applied by the signal processing chain 101.

The calibration of the IC is normally done during a production test process and requires accurate measurement of the relative gain and phase of the input and output signals. External test equipment can be installed for this purpose but using built-in detectors like 104 is significantly cheaper. Once the gain and phase has been measured using the measurement apparatus 104, the systems 200, 300 may be configured to store correction values in a One-Time-Programmable OTP memory that finalizes the gain and phase calibration of the signal processing chain 101. The built-in gain and phase detector can also be used to test or measure other parameters like gain and phase control range, gain and phase resolution, gain flatness, gain to phase error of a Variable Gain Amplifier VGA in the signal processing chain, phase to gain error of the Vector Modulator VM in the signal processing chain, and gain compression levels.

In certain cases, the input and output of the signal processing chain 101 can have a signal power difference of 20-40 dB which can create the following problems:

1. Isolation: Taking a 40 dB signal difference between the input and output signals means that 50-60 dB isolation between the two signal paths of the measurement apparatus 104 is needed to not materially impact accuracy. This is especially true in the multiplexers of the phase/gain detectors within the measurement apparatus. Within the multiplexers, the signals cross each other which can lead to crosstalk at the mm wave frequencies of interest.
2. Mixer-induced errors: The measurement apparatus 104 may include a signal mixer which has two inputs which may be configured as a typical Gilbert cell arrangement. The amplitude and phase transfer from inputs to output of such a Gilbert cell depend on whether the small input signal is at the common emitter terminal with the large input signal at the common base terminal or vice versa.
3. Limited DC output signal: The output of the measurement apparatus 104 signal is DC after an internal mixer stage, but may need to be amplified by a Trans-Impedance-Amplifier (TIA) to get practical voltages out (i.e. to generate output voltages greater than 400 mV); this TIA can only have a limited amount of gain due to device mismatches leading to DC offsets. The DC offset can clip the output to supply or ground; therefore it is of importance that the mixer generates enough DC output signal current.

The attenuator arrangement 200, 300 reduces or removes the signal power difference between the two inputs provided to the measurement apparatus 104. The attenuation provided by the attenuator arrangement 205, 306 should keep certain parameters low, these parameters include:

Insertion loss,
Spread on the gain difference between the two paths,
Spread on the phase difference between the two paths.

Thus, in summary, the first attenuation path (and the second attenuation path if present) of the attenuator arrangement is configured to provide, selectively, for attenuation of the signal from said one of the first SPC terminal and the second SPC terminal to the measurement apparatus. The attenuator arrangement is configured to provide said selective attenuation to make the signal power of the signal from said first SPC terminal and the second SPC terminal more equal. The attenuator arrangement 200, 300 may be configured to measure the signal power of the signals at the SPC terminals to determine whether the first attenuation path should be active or not or which of the first and second attenuation path should be selectively activated to attenuate (i.e. attenuate the signal with the higher signal power/amplitude). Alternatively, the SPC itself may receive a control signal to determine whether it acts as a transmitter or receiver and this signal or one derived therefrom can provide for control of the attenuator arrangement to selectively attenuate the signal with the higher power and not to attenuate the signal with the lower power (or perhaps attenuate the lower power signal to a lesser degree). In other examples, the SPC may operate on a schedule and therefore the attenuator arrangement may selectively attenuate the appropriate signal according to the schedule. Thus, the attenuator arrangement may provide for its selective attenuation in different ways. The fact the attenuation is selective, i.e. the attenuation can be activated or deactivated (or changed to a different level of attenuation) means that the signal power of the signals received by the measurement apparatus may be effectively controlled to provide more accurate operation of the measurement apparatus 104.

Figure 4:
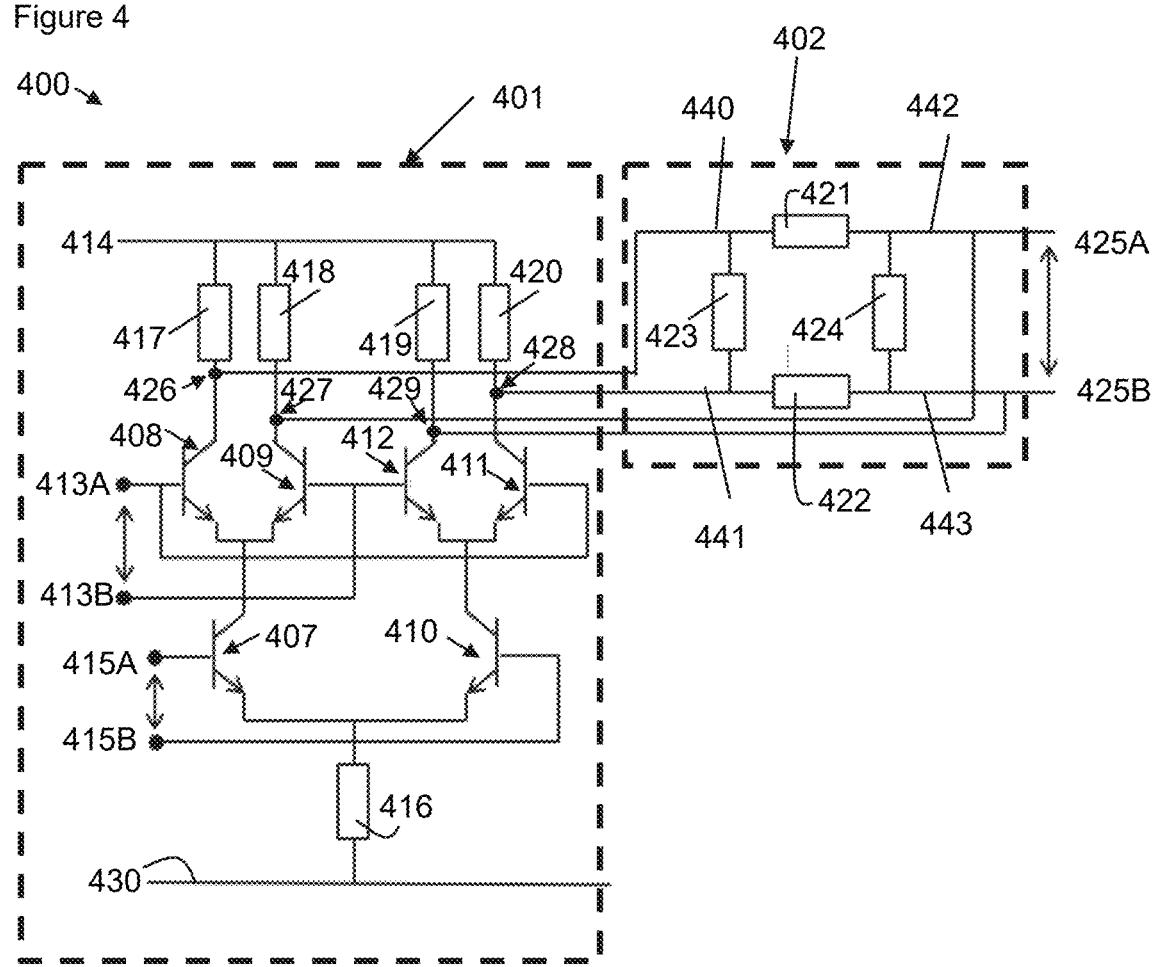
FIG. 4 shows an example embodiment of an attenuation path of an attenuator arrangement having a switching circuit and an attenuator ladder configured to attenuate or not attenuate the signal passing through the attenuation path.

FIG. 4 shows an example attenuation path 400, which may comprise either of the first attenuation path 205 or the second attenuation path 306. The attenuation path comprises a switching circuit 401. The switching circuit may be configured to achieve low insertion losses. In some examples it may provide some gain. The attenuation path 400 further comprises an attenuator ladder 402. The attenuator ladder may comprise a resistor-only attenuator ladder 402, which may ensure low spread is maintained. The attenuation path 400 of FIG. 4 may, in one or more examples, provide very low spreads which are in the region of 2 dB/4 degrees and—together with the switching circuit—the insertion loss may be turned into a small gain of about 2 dB if required.

Thus, FIG. 4 shows an example attenuation path which may selectively attenuating a differential signal. Thus, the attenuation path may provide for attenuation of a signal provided thereto in a first mode and may provide for no attenuation (or a different level of attenuation) in a second mode.

The attenuation path 400 comprises a differential input comprising a first input terminal 415A and a second input terminal 415B for receiving a differential input signal. A differential output comprises a first output terminal 425A and a second output terminal 425B for outputting a differential output signal that has been selectively attenuated. Thus, the differential input signal provided at the differential input may be attenuated or not attenuated depending on the action of the attenuation path 400 and then provided as the (attenuated or not attenuated) differential output signal.

The switching circuit 401, in this example, is provided for routing the differential input signal through an attenuator ladder where the signal is attenuated or to the differential output of the attenuation path 400 thereby bypassing the attenuation of the attenuator ladder. The switching circuit 401 comprises at least a first cascode arrangement 407 and 408, a second cascode arrangement 407 and 409, a third cascode arrangement 410 and 411 and a fourth cascode arrangement 410 and 412. The cascode arrangements may alternatively be referred to as transistor pair arrangements.

The first and second cascode arrangements are configured to pass a first signal from the first input terminal 415A to one of a first cascode output terminal 426 and a second cascode output terminal 427 and block the first signal to the other of the first cascode output terminal 426 and the second cascode output terminal 427 based on a first selector signal provided at 413A and a second selector signal provided at 413B. The third and fourth cascode arrangements are configured to pass a second signal from the second input terminal 415B to one of a third cascode output terminal 428 and a fourth cascode output terminal 429 and block the second signal to the other of the third cascode output terminal 428 and the fourth cascode output terminal 429 based on a third selector signal and a fourth selector signal.

Thus, the cascode arrangements act as switches to route the first and second signals to corresponding parts of the attenuator ladder 402 for attenuation or to the differential output.

The attenuation path may include a controller (not shown) configured to generate at least the first selector signal, the second selector signal, the third selector signal and the fourth selector signal. In the embodiment of FIG. 4, the same selector signal is used to control both the first cascode arrangement 408, 407 and third cascode arrangement 411, 410. Further, the same selector signal is used to control both the second cascode arrangement 409, 407 and fourth cascode arrangement 411,410.

The attenuator ladder 402 provides for the attenuation of the differential input signal. In particular, the switching circuit 401 applies the differential input signal to different positions on the attenuator ladder 402 depending on the attenuation required, by way of the aforementioned selector signals. The attenuator ladder 402 comprises at least one first balanced pi-section resistive attenuator pad arrangement 421-424. However, in other examples a T-section or bridged-T section attenuator arrangement may be used. The attenuator arrangement may be resistor-only based.

The attenuator ladder 402 comprises at least one first balanced pi-section resistive attenuator pad arrangement 421-424 having a first pad input terminal 440 and second pad input terminal 441 and a first pad output terminal 442 and second pad output terminal 443, wherein the first and second pad output terminals 442, 443 are coupled to the first output terminal 425A and the second output terminal 4256 of the differential output (Vout) respectively. In this example, the first and second pad output terminals 442, 443 are coupled directly to the differential output comprising terminals 425A, 425B. In other examples, other components, such as components to provide for further attenuation, may be present between the pad arrangement 421-424 and the differential output.

The first cascode output terminal 426 is coupled to the first pad input terminal 440 and the third cascode output terminal 428 is coupled to the second pad input terminal, such that said at least one first balanced pi-section resistive attenuator pad arrangement provides for attenuation of the first signal and the second signal to provide the differential output signal. Thus, by applying the first and second signals to the attenuator ladder at these points, the first and second signal are attenuated by the pad arrangement 421-424 before the differential output. The second cascode output terminal 427 is coupled to the first pad output terminal 442 and the fourth cascode output terminal 429 is coupled to the first pad output terminal 443. Thus, by applying the first and second signals to the attenuator ladder at these points, the first and second signal are not attenuated by the pad arrangement 421-424 and are applied directly (in this but not all examples) to the differential output.

As mentioned above, it should be noted that the first pad output terminal 442 and second pad output terminal 443 do not necessarily directly couple to the differential output and it may be that the pad output terminals 442,443 are coupled to the differential output via a further balanced pi-section resistive attenuator pad arrangement or alternatively additional components to allow for impedance matching etc.

The first attenuation path 400 shows the path taken by each of the first and second signal from input terminals 415A and 415B of each differential signal taken from either the first 102 or second terminal 103 of the circuit under test/signal processing chain 101. The use of a plurality of cascode arrangements acting as switches rather than attenuators themselves, which direct the signals to the attenuator ladder for discrete levels of attenuation is advantageous. Such an arrangement may provide for controlled levels of attenuation.

Each input to the measurement apparatus 104 from either the first or the second terminal 102, 103 of the signal processing chain can have such an attenuation path 205, 306, 400 applied to it (as shown in FIG. 3). Thus, a first attenuation path may provide for selective attenuation of the signal from the first terminal 102 and a second attenuation path may provide for selective attenuation of the signal from the second terminal 103. It will be appreciated that for signal processing chain 101 that operates in only one of either a transmit or a receive mode, a single attenuation path 400 may be sufficient. For a signal processing chain 101 which comprises a transceiver, the differential signals from both the first and second terminals 102, 103 may require selective attenuation depending on whether the transceiver is receiving or transmitting. Thus, if the terminal 102 is an input and the terminal 103 is an output in the transmit mode, then the attenuation path 205, 306, 400 coupled with the output may select to provide said attenuation while the attenuation path coupled with the input may select not to provide attenuation. If the terminal 102 is an output and the terminal 103 is an input in the receive mode, then the attenuation path coupled with the output may select to provide said attenuation while the attenuation path coupled with the input may select not to provide attenuation.

Accordingly, the attenuation path 400 shown in FIG. 4 may have two modes of operation, in a first mode the attenuation path 400 operates to direct the first and second signal such that they are attenuated by the pad arrangement 41-424, wherein a first level of attenuation is provided to the signal. In a second mode of operation the attenuation path 400 operates to bypass the pad arrangement 41-424, wherein a second level of attenuation is provided to the signal, which in this example comprises no attenuation given that the first and second signal is coupled to the differential output, bypassing the pad arrangement 421-424.

In some embodiments the second mode will provide a lower level of attenuation to that provided by the first mode.

Thus, in summary, the controller may be configured to provide said first to fourth selector signals to bias the respective cascode arrangements to provide for, in the first mode:

passing of the first signal from first terminal 415A to the first cascode output terminal 426 and blocking the first signal to the second cascode 426 output terminal; and passing of the second signal from the second terminal 415B to the third cascode output terminal 428 and blocking the second signal to the fourth cascode output terminal 429; and, in a second mode;

passing of the first signal from first terminal 415A to the second cascode output terminal 427 and blocking the first signal to the first cascode output terminal 426; and passing of the second signal from second terminal 415B to the fourth cascode output terminal 429 and blocking the second signal to the third cascode output terminal 428.

The embodiment of FIG. 4 will be described in more detail below in addition to further embodiments of the attenuation path 400, 500 and 600 in FIGS. 5 and 6.

However, common to all embodiments, it will be appreciated that the switching circuit 401 is configured such that the first selector signal 413A is applied to the respective cascode arrangement 407, 408 or to a component coupled with said respective cascode arrangement to cause the cascode arrangement to provide said respective passing and blocking of said first signal to the first cascode output terminal 426.

Likewise, it will be appreciated that the switching circuit 401 is configured such that the second selector signal 413B is applied to the respective cascode arrangement 407, 409 or to a component coupled with said respective cascode arrangement to cause the cascode arrangement to provide said respective passing and blocking of said first signal to the second cascode output terminal 427.

Likewise, it will be appreciated that the switching circuit 401 is configured such that the third selector signal is applied to the respective cascode arrangement 410, 411 or to a component coupled with said respective cascode arrangement to cause the cascode arrangement to provide said respective passing and blocking of said second signal to the third cascode output terminal 428.

Likewise, it will be appreciated that the switching circuit 401 is configured such that the fourth selector signal is applied to the respective cascode arrangement 410, 412 or to a component coupled with said respective cascode arrangement to cause the cascode arrangement to provide said respective passing and blocking of one of said second signal to the fourth cascode output terminal 429.

The passing and blocking action of the cascode arrangement may be provided, in part, by the controller being configured to provide a selector signal having a voltage or current that places each of the first to fourth cascode arrangements into a "conductive" state or a voltage or current that places each of the first to fourth cascode arrangements into a "non-conductive state".

As will be known by those skilled in the art, a balanced pi-section attenuator pad arrangement 421-424 typically comprises an arrangement of four resistors or six resistors. In particular, in one or more examples, the balanced pi-section resistive attenuator pad arrangement comprises a first, "shunt", resistor 421 having first and second terminals configured to be in series with the first pad input terminal 440 and the first pad output terminal 442, a second, "shunt", resistor 422 having first and second terminals configured to be in series with the second pad input terminal 441 and the second pad output terminal 443, a third resistor 423 coupled in parallel between corresponding first terminals of the first resistor 421 and the second resistor 422 and a fourth resistor 424 coupled in parallel between corresponding second terminals of the first resistor 421 and the second resistor 422.

The first resistor 421 and the second resistor 422 are configured to have the same resistance. The third resistor 423 and the fourth resistor 424 are configured to have the same resistance. By proper dimensioning of the pi-section attenuator pad arrangement 421-424, the attenuation path 400 can be configured to provide the required level of attenuation to enable accurate DC outputs in the measurement apparatus 104.

Turning to the switching circuit 401, it can be seen that, in one or more examples, the first and second cascode arrangements 408, 409, 407 share a lower transistor 407. Likewise, it can be seen that, in one or more examples, the third and fourth cascode arrangements 410, 410, 412 share a lower transistor 410.

Thus, the first cascode arrangement comprises a first upper transistor 408 coupled in series with a first shared lower transistor 407 and the second cascode arrangement comprises a second upper transistor 409 coupled in series with said first shared lower transistor 407. A collector terminal of said first upper transistor provides the first cascode output terminal 426 and a collector terminal of said second upper transistor provides the second cascode output terminal 427. The emitter terminal of the first and second upper transistor is coupled to a collector terminal of the first shared lower transistor 407, and a base terminal of said first shared lower transistor is configured to receive the first signal from the first input terminal 415A.

The third cascode arrangement comprises a third upper transistor 411 coupled in series with a second shared lower transistor 410 and the fourth cascode arrangement comprises a fourth upper transistor 412 coupled in series with said second shared lower transistor 410. A collector terminal of said third upper transistor provides the third cascode output terminal 429 and a collector terminal of said fourth upper transistor provides the fourth cascode output terminal 428. The emitter terminal of the third and fourth upper transistor is coupled to a collector terminal of the second shared lower transistor 410, and a base terminal of said second shared lower transistor is configured to receive the second signal from the second input terminal 415B.

As mentioned above, the first to fourth selector signals in this example are provided by a first same selector signal applied to the first and third cascode arrangements and a second same selector signal applied to the second and fourth cascode arrangements.

In particular, the first same selector signal is provided at 413A by the controller and is applied to the base terminal of the first upper transistor 408 and the base terminal of the third upper transistor 411. Further, the second same selector signal is provided at 413B by the controller and is applied to the base terminal of the second upper transistor 408 and the base terminal of the fourth upper transistor 411.

Further in the example of FIG. 4, the collector terminal of the upper transistors 408, 409, 411, 412 of the cascode arrangements are configured to be coupled to a supply voltage terminal 414 via a load resistor 417, 418, 419, 420 respectively.

Further in the example of FIG. 4, the emitter terminal of the first and second shared lower transistor 407, 410 of the cascode arrangements are configured to be coupled to a reference voltage terminal 430 via a resistor 416.

It will also be appreciated that cascode arrangements can be formed of either BJT type or FET type transistors and can also be formed by a combination of different types of transistors. It will be appreciated that the emitter, base and collector of a BJT transistor are analogous to the source, gate and drain terminal of a FET type transistor and therefore where the transistors are referred to BJTs having a collector, emitter and base terminal they may alternatively comprise FETs having a source, drain and gate terminal.

The use of a shared lower transistor in the first to fourth cascode arrangements may reduce the effect of any additional errors due to manufacturing tolerances in the transistors.

While FIG. 4 shows a switching circuit 401 in which the first to fourth cascode arrangements share lower transistors, in other examples, this may not be the case. For example, each of the first to fourth cascode arrangements may have their own lower transistor. Further, FIG. 6, which will be described later, does not use such a shared lower transistor arrangement. Thus, more generally, the first cascode arrangement may comprise an upper transistor 408 in series with a lower transistor 407 and wherein a collector terminal of said upper transistor provides the first cascode output terminal 426, an emitter terminal of the upper transistor is coupled to a collector terminal of the lower transistor, a base terminal of said lower transistor is configured to receive the first signal 415A. The second cascode arrangement may comprise an upper transistor 409 in series with a lower transistor 407 and wherein a collector terminal of said upper transistor provides the second cascode output terminal 427, an emitter terminal of the upper transistor is coupled to a collector terminal of the lower transistor, a base terminal of said lower transistor is configured to receive the first signal 415A. The third cascode arrangement may comprise an upper transistor 411 in series with a lower transistor 410 and wherein a collector terminal of said upper transistor provides the third cascode output terminal 429, an emitter terminal of the upper transistor is coupled to a collector terminal of the lower transistor, a base terminal of said lower transistor is configured to receive the second signal 415B. The fourth cascode arrangement may comprise an upper transistor 412 in series with a lower transistor 410 and wherein a collector terminal of said upper transistor provides the fourth cascode output terminal 428, an emitter terminal of the upper transistor is coupled to a collector terminal of the lower transistor, a base terminal of said lower transistor is configured to receive the second signal 415B.

FIG. 4 shows an example in which the first mode provides for attenuation and the second mode provides for no attenuation. Example FIG. 5 shows an example in which three different levels of attenuation are provided, for example, a higher level of attenuation, a lower level of attenuation and no attenuation. The same reference numerals that were used in FIG. 4 have been used for like parts in FIG. 5 with the series starting at "500" rather than "400".

This is achieved by using an attenuator ladder 502 with more than one balanced pi-section resistive attenuator pad arrangement 521-524, 531-534 and a switching circuit 501 to route the appropriate signal to a point along the attenuator ladder in order to apply the required level of attenuation to the first and second signal. Thus, FIG. 5 shows an example having at least one first balanced pi-section resistive attenuator pad arrangement 521-524 and at least one second balanced pi-section resistive attenuator pad arrangement 531-534. As mentioned previously, the balanced pi-section attenuator pad may comprise different resistor arrangements.

Figure 5:
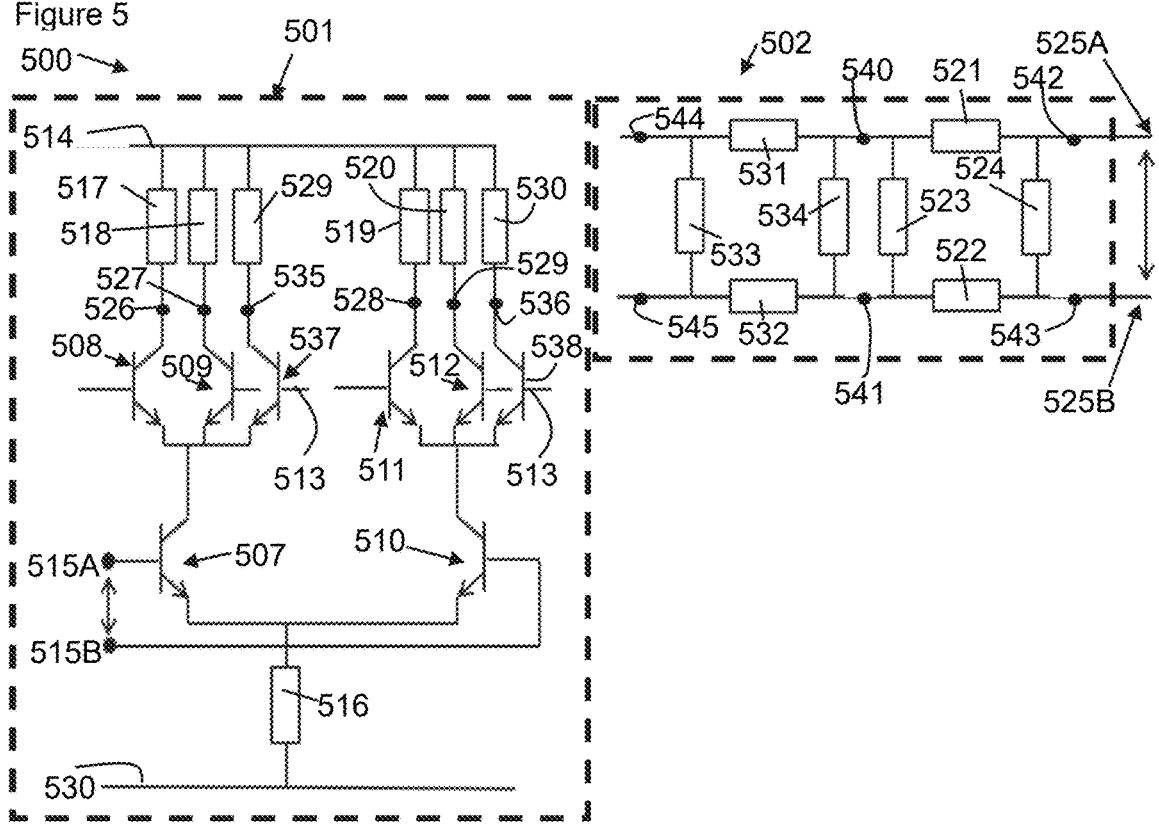
FIG. 5 shows a second example embodiment of an attenuation path of an attenuator arrangement having a switching circuit and an attenuator ladder configured to attenuate by a first amount, attenuate by a second, higher amount or not attenuate the signal passing through the attenuation path.

Example FIG. 5 also shows two further cascode arrangements that added to the arrangement of FIG. 4 and allows for routing to the different positions on the attenuator ladder 502.

Thus, FIG. 5 shows a fifth cascode arrangement 507, 537 (also sharing the first shared lower transistor in this example) comprising a fifth cascode input terminal (base of the first shared lower transistor) configured to receive the first signal from the first input terminal 515A, a fifth cascode output terminal 535 and a fifth selector terminal 513 (base terminal of the upper transistor 537). The fifth cascode arrangement is configured to control the passage of the first signal to the fifth cascode output terminal 535 based on a fifth selector signal received from the controller at the fifth selector terminal.

Example FIG. 5 also shows a sixth cascode arrangement 510, 538 (also sharing the first shared lower transistor in this example) comprising a sixth cascode input terminal (base of the second shared lower transistor) configured to receive the second signal from the second input terminal 515B, a sixth cascode output terminal 536 and a sixth selector terminal 513 (base terminal of the upper transistor 538). The sixth cascode arrangement is configured to control the passage of the second signal to the sixth cascode output terminal 536 based on a sixth selector signal received from the controller at the sixth selector terminal.

Turning to the attenuator ladder 502, it comprises at least one second balanced pi-section resistive attenuator pad arrangement 531-534 having a first and a second pad input terminal 544, 545 and a first and a second pad output terminal, wherein the first and second pad output terminals of the second balanced pi-section resistive attenuator pad arrangement 531-534 are coupled to the first and second pad input terminals 540, 541 of the first balanced pi-section resistive attenuator pad arrangement 521-524; and wherein the fifth cascode output terminal 535 and the sixth cascode output terminal 536 are coupled to the first pad input terminal 544 and second pad input terminal 545 of the second balanced pi-section resistive attenuator pad arrangement 531-534 respectively such that said at least one second balanced pi-section resistive attenuator pad arrangement and at least one first balanced pi-section resistive attenuator pad arrangement provides for attenuation of the first signal and the second signal to provide the differential output signal.

Thus, with the appropriate selector signals, the first and second signals from input terminals 515A, 515B can be selectively coupled to the terminals 544 and 545 by the fifth and sixth cascode arrangements (and blocked by the first to fourth cascode arrangements) where they will be attenuated by both the second balanced pi-section resistive attenuator pad arrangement 531-534 and the first balanced pi-section resistive attenuator pad arrangement 521-524 before being output at the first output terminal 525A and the second output terminal 525B.

The passing and blocking action of the cascode arrangement may be provided, in part, by the controller being configured to provide a selector signal having a voltage or current that places each of the first to sixth cascode arrangements into a "conductive" state or a voltage or current that places each of the first to sixth cascode arrangements into a "non-conductive state".

The controller to generate the control signals is configured to output a selectable selector voltage. The selector voltage can be selectable from one of, a first selector voltage level configured to bias the respective one of the first to sixth cascode arrangements to enable a path to the respective cascode output terminal or a second selector voltage level configured to bias the respective one of the first to sixth cascode arrangements to block a path to the respective cascode output terminal.

In one or more example embodiment the selector signal voltage levels may comprise a positive voltage and a negative voltage. For example, the voltage levels on top of an appropriate DC level of for example 2V relative to ground 530 to cause the passing and blocking action may be +0.3V and −0.3V, or may be any set of voltages that can allow for discrete switching of the cascode arrangements.

The attenuator path 500 of FIG. 5 uses six cascode arrangements and two pad arrangement in the attenuator ladder to provide three different levels of attenuation. It will be appreciated that in other examples (not shown) further cascode arrangements can be added to provide additional attenuation amounts by coupling to the differential output 525A, 525B though different numbers of balanced pi-section resistive attenuator pad arrangements.

In the example shown in FIG. 5, the controller may be configured to provide three modes of operation, these are the high attenuation mode (mode a), minimal attenuation/bypass mode (mode b) and intermediate attenuation (mode c). The three settings/modes shown in FIG. 5 are described below:

mode a: the selector signal provided to the upper transistor 537 of the fifth cascode arrangement and the upper transistor 538 of the sixth cascode arrangement has a voltage that causes the fifth and sixth cascode arrangements to pass the first and second signals respectively. The voltage of the selector signals applied to the upper transistors of the remaining cascode arrangements is such that causes the first, second, third and fourth cascode arrangements to block the first and second signals respectively. In this configuration the first signal is output to output terminal 535 which couples to the point 544 of the attenuator ladder and the second signal is output to output terminal 536 which couples to the point 545 of the attenuator ladder. The first and second signal therefore passes through the second pad arrangement 531-534 and the first pad arrangement 521-524 and thus the level of attenuation is high.

mode b: the selector signal provided to the upper transistor 509 of the second cascode arrangement and the upper transistor 512 of the fourth cascode arrangement has a voltage that causes the second and fourth cascode arrangements to pass the first and second signals respectively. The voltage of the selector signals applied to the upper transistors of the remaining cascode arrangements is such that causes the first, third, fifth and sixth cascode arrangements to block the first and second signals respectively. In this configuration the first signal is output to output terminal 527 which couples to the point 542 of the attenuator ladder and the second signal is output to output terminal 529 which couples to the point 543 of the attenuator ladder. The first and second signal therefore passes through neither of the first and second pad arrangement 531-534, 521-524 and thus the level of attenuation is minimal.

mode c: the selector signal provided to the upper transistor 508 of the first cascode arrangement and the upper transistor 512 of the third cascode arrangement has a voltage that causes the first and third cascode arrangements to pass the first and second signals respectively. The voltage of the selector signals applied to the upper transistors of the remaining cascode arrangements is such that causes the second, fourth, fifth and sixth cascode arrangements to block the first and second signals respectively. In this configuration the first signal is output to output terminal 526 which couples to the point 540 of the attenuator ladder and the second signal is output to output terminal 528 which couples to the point 541 of the attenuator ladder. The first and second signal therefore passes through only the first pad arrangement 521-524 and thus the level of attenuation is intermediate to that in the other modes.

The first through sixth cascode arrangements may be configured to be coupled to a supply voltage provided at 514 through respective load resistors 517, 518, 529 and 519, 520, 530.

Figure 6:
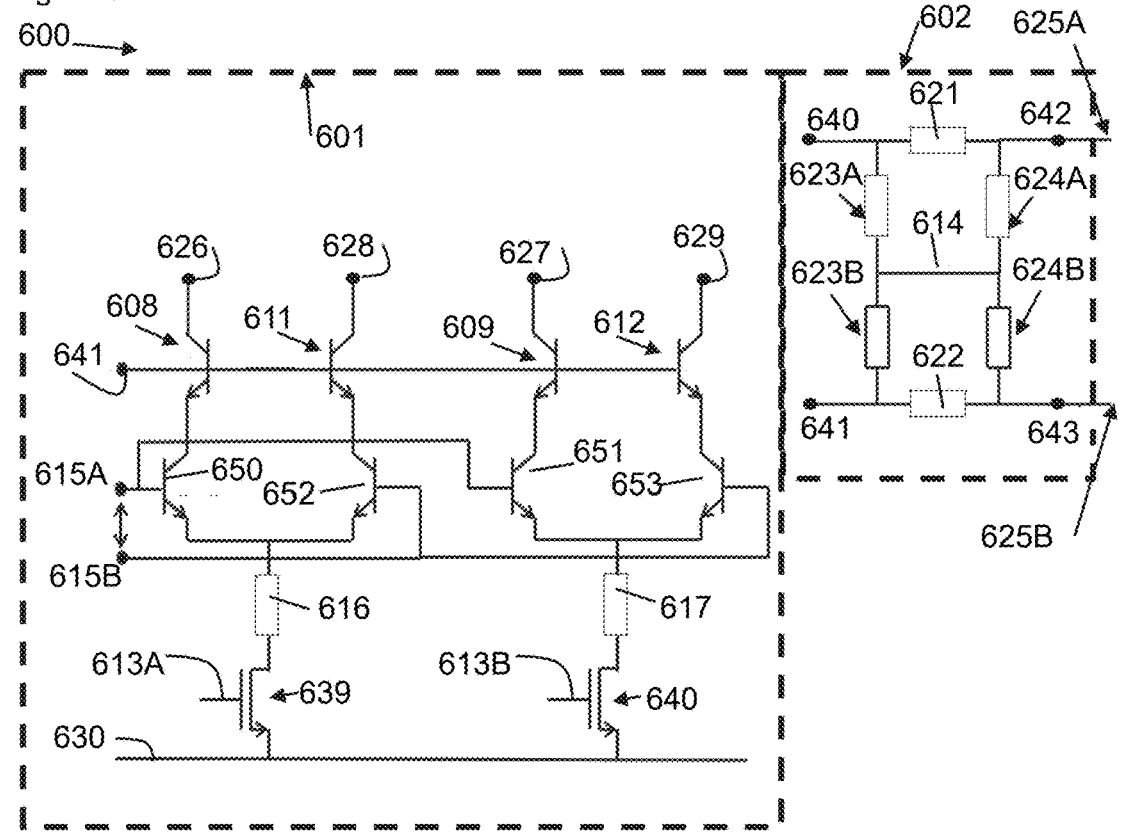
FIG. 6 shows a third example embodiment of an attenuation path of an attenuator arrangement having a switching circuit and an attenuator ladder configured to attenuate or not attenuate the signal passing through the attenuation path.

Example FIG. 6 shows a further embodiment. In this example, the switching circuit 601 does not use the shared lower transistor configuration as used in FIGS. 4 and 5. Thus, the first to fourth cascode arrangements each comprise an upper and lower transistor. In the example of FIG. 6, the selector signals are applied to the cascode arrangements by the action of a transistor coupled between the lower transistor of each of the cascode arrangements and a reference voltage terminal, such as ground.

Thus, the first cascode arrangement comprises an upper transistor 608 having an emitter terminal coupled with a collector terminal of a lower transistor 650. The second cascode arrangement comprises an upper transistor 609 having an emitter terminal coupled with a collector terminal of a lower transistor 651. The third cascode arrangement comprises an upper transistor 611 having an emitter terminal coupled with a collector terminal of a lower transistor 652. The fourth cascode arrangement comprises an upper transistor 612 having an emitter terminal coupled with a collector terminal of a lower transistor 653.

The first cascode arrangement 608, 650 comprises a first cascode input terminal (base terminal of the lower transistor 650) configured to receive the first signal from the first input terminal 615A, a first cascode output terminal 626 (collector of the upper transistor) and a first selector terminal 613A, wherein the first cascode arrangement is configured to control the passage of the first signal to the first cascode output terminal 626 based on a first same selector signal received from the controller at the first selector terminal 613A.

The second cascode arrangement 609, 651 comprises a second cascode input terminal (base terminal of the lower transistor 651) configured to receive the first signal from the first input terminal 615A, a second cascode output terminal 627 (collector of the upper transistor) and a second selector terminal 613B, wherein the second cascode arrangement is configured to control the passage of the first signal to the second cascode output 627 terminal based on a second same selector signal received from the controller at the second selector terminal 613B.

The third cascode arrangement 611, 652 comprises a third cascode input terminal (base terminal of the lower transistor 652) configured to receive the second signal from the second input terminal 615B, a third cascode output terminal 628 (collector of the upper transistor) and a third selector terminal 613A, wherein the third cascode arrangement is configured to control the passage of the second signal to the third cascode output terminal 628 based on the first same selector signal received from the controller at the first selector terminal 613A.

The fourth cascode arrangement 612, 653 comprises a fourth cascode input terminal (base terminal of the lower transistor 653) configured to receive the second signal from the second input terminal 615B, a fourth cascode output terminal 629 (collector of the upper transistor) and a fourth selector terminal 613B, wherein the fourth cascode arrangement is configured to control the passage of the second signal to the fourth cascode output terminal 629 based on the second same selector signal received from the controller at the second selector terminal 613B.

It will be appreciated that, in this example, although the term "cascode arrangement" is used to refer to the pairs of transistors 608, 650; 609, 651; 611, 652; and 612, 653, the switching circuit 601 can also be considered to comprise transistors 608, 611, 609 and 612 operating as cascode transistors, with transistors 650 and 652 acting as a first differential pair of amplifying transistors and transistors 651 and 653 acting as a second differential pair of amplifying transistors.

Thus, in this example the selector signals from the controller are applied to a further transistor 639 and 640 to provide for the biasing of the cascode arrangements to provide the passing and blocking action.

The attenuation path 600 in FIG. 6 shows an emitter terminal of the lower transistor of both the first cascode arrangement 608, 650 and the third cascode arrangement 611, 652 are coupled to a drain terminal of a first MOSFET 639 for controlling the passing and blocking action of the first and third cascode arrangements. The source terminal of said first MOSFET is configured to be coupled to a reference voltage at 630. The gate terminal 613A of said first MOSFET is configured to receive said same first selector signal.

The emitter terminal of the lower transistor of both the second cascode arrangement 609, 651 and the fourth cascode arrangement 612, 653 are coupled to a drain terminal of a second MOSFET 640 for controlling the passing and blocking action of the second and fourth cascode arrangements. The source terminal of said second MOSFET is configured to be coupled to a reference voltage at 630. The gate terminal 613B of said second MOSFET is configured to receive said same second selector signal.

In the attenuation path 600 of FIG. 6, the base terminals of the upper transistors of the first to fourth cascode arrangements may be configured to be coupled to a bias terminal 641 for receiving a constant bias voltage.

It will be appreciated that the MOSFETs 639 and 640 may, in a different example, comprise a different transistor type suitable for receiving the appropriate selector voltage and biasing the cascode arrangements. In other examples, the MOSFETs 639, 640 may be replaced with suitable switchable current sources to provide the same functionality.

In one or more examples, a first resistor 616 is coupled between the drain terminal of the MOSFET 639 and the emitter terminal of the first cascode arrangement 607, 608 and third cascode arrangement 610, 611. In one or more examples, a second resistor 617 is coupled between the drain terminal of said second MOSFET 640 and the emitter terminal of said second cascode arrangement 607, 609 and fourth cascode arrangement 610, 612.

As with the embodiment of FIG. 5, the embodiment of FIG. 6 can also be extended to any number of cascode arrangements or "stages" to provide the different levels of attenuation.

The advantages of the switching circuit 601 of FIG. 6 is that the cascode arrangements are now, on the one hand, all biased at a constant bias voltage (Vcasc) applied at 641, and on the other hand, are loaded by the same collector impedance, irrespective of which differential pairs is switched to block or pass. Therefore, a smoother differential output voltage at mm wave frequencies may be achieved.

The first to fourth cascode output terminals couple at specific points in the attenuator ladder 602 to introduce a desired level of attenuation in the same way as described for the configuration of the embodiment shown in FIG. 4. However, the connection to the attenuation ladder 602 in FIG. 6 is direct, without load resistors 417-420 as depicted in FIG. 4 and FIG. 5, thus saving hardware.

Turning to the attenuator ladder 602 there is provided at least one first balanced pi-section resistive attenuator pad arrangement 621, 622, 623A, 623B, 624A, 624B. However, in this example, the third resistor comprises a pair of resistors 623A, 623B in series with a node therebetween and the fourth resistor comprises a pair of resistors 624A, 624B in series with a node therebetween, wherein the nodes between each pair of resistors are configured to be coupled to a supply voltage provided at 614.

The coupling of the nodes between the pair of series resistors forming the third and the fourth resistors of the balanced pi-section resistive attenuator pad arrangement allows for the common mode component of the differential signal to be attenuated (when said coupling is also coupled to receive a supply voltage).

It will be appreciated that the balanced pi-section resistive attenuator pad arrangements of any of the examples described herein can take the form of that shown in FIG. 6.

Typical resistor values in the pi-section resistive attenuator pads of the attenuator ladder are determined by the amount of attenuation required. For example, a 96Ω shunt resistance with a 71Ω series resistance gives 10 dB attenuation into a 50Ω load (e.g. the input impedance of the measurement apparatus 104).

Alternatively, different resistor values can be used: for example, 61Ω shunt resistors with 247Ω series resistors provides for 20 dB attenuation in 50Ω. The tolerance (sigma on batch-to-batch spread) on these resistors is 3-4%.

Thus, in the example of FIG. 6, in a first mode, the first same selector signal is applied to the first MOSFET 639 with a voltage or current which biases the first and third cascode arrangements to pass the first and second signal respectively. Accordingly, the first signal is passed to the output terminal 626, which couples to point 640 in the attenuator ladder. The second signal is passed to the output terminal 628, which couples to point 641 in the attenuator ladder. The second same selector signal is applied to the second MOSFET 640 with a voltage or current which biases the second and fourth cascode arrangements to block the first and second signal respectively.

In a second mode, the first same selector signal is applied to the first MOSFET 639 with a voltage or current which biases the first and third cascode arrangements to block the first and second signal respectively. The second same selector signal is applied to the second MOSFET 640 with a voltage or current which biases the second and fourth cascode arrangements to pass the first and second signal respectively. Accordingly, the first signal is passed to the output terminal 627, which couples to point 642 in the attenuator ladder. The second signal is passed to the output terminal 629, which couples to point 643 in the attenuator ladder.

In any of the examples herein, the attenuation path 400, 500, 600 may have a switching circuit that includes cascode arrangements have the structure of any of FIGS. 4, 5 and 6. Further the attenuation path 400, 500, 600 may have attenuator ladders 402, 502, 602 have the structure of any of FIGS. 4, 5 and 6.

As shown in FIGS. 2 and 3, we disclose a combination of a signal processing chain 101 having a first terminal 102 and a second terminal 103, a measurement apparatus 104 configured to receive differential signals from the first terminal and the second terminal and either:
an attenuator arrangement for selectively attenuating one of the differential signals comprising one attenuation path 205 (as embodied in 400, 500, 600); or
an attenuator arrangement for selectively attenuating both of the differential signals comprising a first attenuation path 205 (as embodied in 400, 500, 600) and a second attenuation path 306 (as embodied in 400, 500, 600).

Thus, the signal processing chain 101 may comprise a transceiver having a first differential transceiver terminal 102 and a second differential transceiver terminal 103, said transceiver configured to apply one or both of a gain change and a phase change on a signal passed between the first and second differential transceiver terminals, and a measurement apparatus 104, said measurement apparatus configured to measure one or both of the gain and the phase change applied by said transceiver,
wherein said first differential transceiver terminal is coupled to the differential input of the first attenuation path and the differential output of the first attenuation path is coupled to the measurement apparatus; and
wherein said second differential transceiver terminal is coupled to the differential input of the second attenuation path and the differential output of the second attenuation path is coupled to the measurement apparatus.

The attenuation of the signals received by the measurement apparatus 104 may be made more equal by the action of the attenuator arrangement. This may provide for more accurate measurement of the gain change and/or phase change. Clearly, any determination of the gain change and/or phase change made by the measurement apparatus 104 must account for attenuation applied by the attenuator arrangement.

As a practical example, the operating frequencies of the signal processing chain can be at the 5G frequency bands comprising frequencies around the 28 GHz band.

Figure 7:
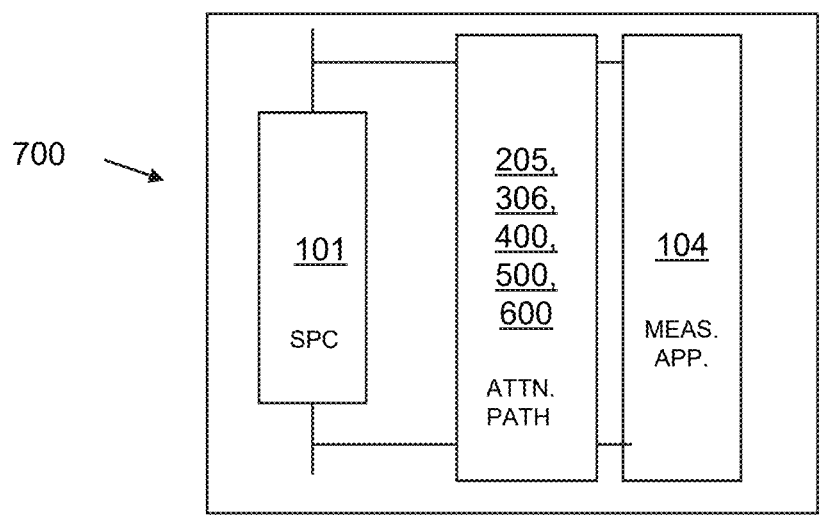
FIG. 7 shows an example integrated circuit.

In one or more embodiments, the attenuator arrangement or, more particularly, the attenuation paths thereof 205, 306, 400, 500, 600, may form part of the measurement apparatus, which may comprise a built-in self-test circuit. FIG. 7 shows an integrated circuit or device 700 in which the attenuation arrangement and the measurement apparatus 104 is on the same integrated circuit as the signal processing chain 101.

The device or IC 700 may comprise a 5G radio transceiver.

In one or more examples, the combination of the attenuator arrangement and the measurement apparatus is configured to track circuit aging whereby the tracking of the gain and/or phase shift of the signal processing chain 101 can be measured during the circuit lifetime to determine effects related to aging of the circuit.

Implementation of the self-calibration and self-testing of large volumes of RFICs using the measurement apparatus and attenuator arrangement disclosed herein may, in some examples, allow for significant cost reductions especially for low unit-cost components such as for wireless communication system RFICs.

In any of the examples, the resistors 416, 516, 616 and 617 may be replaced by a respective current source. Said current source may be switchable or not. Alternatively, the resistors may be replaced by a copy branch of a current mirror, from which the main branch current is either constant (in the case of replacing resistors 416, 516) or can be switch on or off (in the case of replacing 616, 617).

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A circuitry comprising:
a first attenuation circuitry coupled between a first terminal of a signal processing chain and a measurement apparatus; and
a second attenuation circuitry coupled between a second terminal of the signal processing chain and the measurement apparatus, wherein the signal processing chain is configured to apply one or both of a gain change or a phase change to signals passed between the first terminal and the second terminal of the signal processing chain, and one or both of the gain change or the phase change applied to the signals is measured by the measurement apparatus;
wherein the first attenuation circuitry and the second attenuation circuitry are configured to selectively attenuate first signals provided from the first signal processing chain (SPC) terminal to the measurement apparatus or second signals provided from the second SPC terminal to the measurement apparatus to reduce a difference between a first signal power of the first signals provided from the first SPC terminal to the measurement apparatus and a second signal power of the second signals provided from the second SPC terminal to the measurement apparatus.

2. The circuitry of claim 1 wherein the first attenuation circuitry and the second attenuation path each comprise:
a differential input (Vin) comprising a first input terminal and a second input terminal for receiving a differential input signal from one of the first SPC terminal or the second SPC terminal;
a differential output (Vout) comprising a first output terminal and a second output terminal for providing a differential output signal that has been selectively attenuated to the measurement apparatus;
a switching circuit comprising at least a first cascode arrangement, a second cascode arrangement, a third cascode arrangement and a fourth cascode arrangement,
wherein the first and second cascode arrangements are configured to pass a first signal from the first input terminal to one of a first cascode output terminal and a second cascode output terminal and block the first signal to the other of the first cascode output terminal and the second cascode output terminal based on a first selector signal and a second selector signal, and
wherein the third and fourth cascode arrangements are configured to pass a second signal from the second input terminal to one of a third cascode output terminal and a fourth cascode output terminal and block the second signal to the other of the third cascode output terminal and the fourth cascode output terminal based on a third selector signal and a fourth selector signal; and
a controller configured to generate at least the first selector signal, the second selector signal, the third selector signal and the fourth selector signal, and
an attenuator ladder comprising at least one first balanced pi-section resistive attenuator pad arrangement having a first and a second pad input terminal and a first and a second pad output terminal, wherein the first and second pad output terminals are coupled to the first output terminal and the second output terminal of the differential output (Vout) respectively, and
wherein the first cascode output terminal and the third cascode output terminal are coupled to the first pad input terminal and second pad input terminal respectively such that said at least one first balanced pi-section resistive attenuator pad arrangement provides for attenuation of the first signal and the second signal to provide the differential output signal; and
wherein the second cascode output terminal and the fourth cascode output terminal are coupled to the first pad output terminal and second pad output terminal respectively.

3. The circuitry of claim 2 wherein the first balanced pi-section resistive attenuator pad arrangement comprises a first resistor having first and second terminals configured to be in series with the first pad input terminal and the first pad output terminal, a second resistor having first and second terminals configured to be in series with the second pad input terminal and the second pad output terminal, a third resistor coupled in parallel between corresponding first terminals of the first resistor and the second resistor and a fourth resistor coupled in parallel between corresponding second terminals of the first resistor and the second resistor.

4. The circuitry of claim 3 wherein the third resistor comprises a pair of resistors in series with a node therebetween and the fourth resistor comprises a pair of resistors in series with a node therebetween, wherein the nodes between each pair of resistors are configured to be coupled to a supply voltage (vcc).

5. The circuitry of claim 2 wherein the first cascode arrangement comprises a first cascode input terminal configured to receive the first signal from the first input terminal, a first cascode output terminal and a first selector terminal, wherein the first cascode arrangement is configured to control the passage of the first signal to the first cascode output terminal based on the first selector signal received from the controller at the first selector terminal, and
 the second cascode arrangement comprises a second cascode input terminal configured to receive the first signal from the first input terminal, a second cascode output terminal and a second selector terminal, wherein the second cascode arrangement is configured to control the passage of the first signal to the second cascode output terminal based on the second selector signal received from the controller at the second selector terminal;
 the third cascode arrangement comprises a third cascode input terminal configured to receive the second signal from the second input terminal, a third cascode output terminal and a third selector terminal, wherein the third cascode arrangement is configured to control the passage of the second signal to the third cascode output terminal based on the third selector signal received from the controller at the third selector terminal, and
 the fourth cascode arrangement comprises a fourth cascode input terminal configured to receive the second signal from the second input terminal, a fourth cascode output terminal and a fourth selector terminal, wherein the fourth cascode arrangement is configured to control the passage of the second signal to the fourth cascode output terminal based on the fourth selector signal received from the controller at the fourth selector terminal.

6. The circuitry of claim 2, wherein,
 the first cascode arrangement comprises an upper transistor in series with a lower transistor and wherein a collector terminal of said upper transistor provides the first cascode output terminal, an emitter terminal of the upper transistor is coupled to a collector terminal of the lower transistor, a base terminal of said lower transistor is configured to receive the first signal; and
 the second cascode arrangement comprises an upper transistor in series with a lower transistor and wherein a collector terminal of said upper transistor provides the second cascode output terminal, an emitter terminal of the upper transistor is coupled to a collector terminal of the lower transistor, a base terminal of said lower transistor is configured to receive the first signal,
 the third cascode arrangement comprises an upper transistor in series with a lower transistor and wherein a collector terminal of said upper transistor provides the third cascode output terminal, an emitter terminal of the upper transistor is coupled to a collector terminal of the lower transistor, a base terminal of said lower transistor is configured to receive the second signal,
 the fourth cascode arrangement comprises an upper transistor in series with a lower transistor and wherein a collector terminal of said upper transistor provides the fourth cascode output terminal, an emitter terminal of the upper transistor is coupled to a collector terminal of the lower transistor, a base terminal of said lower transistor is configured to receive the second signal.

7. The circuitry of claim 6, wherein the first selector signal equals the third selector signal and therefore the controller is configured to apply the same selector voltage to the base terminal of the upper transistor of the first and third cascode arrangements to provide for either of said passing or blocking of the first and second signals and
 wherein the second selector signal equals the fourth selector signal and therefore the controller is configured to apply the same selector voltage to the base terminal of the upper transistor of the second and fourth cascode arrangements to provide for either of said passing or blocking of the first and second signal.

8. The circuitry of claim 2, wherein the first cascode arrangement comprises a first upper transistor coupled in series with a first shared lower transistor and the second cascode arrangement comprises a second upper transistor coupled in series with said first shared lower transistor, wherein a collector terminal of said first upper transistor provides the first cascode output terminal and a collector terminal of said second upper transistor provides the second cascode output terminal, an emitter terminal of the first and second upper transistor is coupled to a collector terminal of the first shared lower transistor, and a base terminal of said first shared lower transistor is configured to receive the first signal, and wherein,
 the third cascode arrangement comprises a third upper transistor coupled in series with a second shared lower transistor and the fourth cascode arrangement comprises a fourth upper transistor coupled in series with said second shared lower transistor, wherein a collector terminal of said third upper transistor provides the third cascode output terminal and a collector terminal of said fourth upper transistor provides the fourth cascode output terminal, an emitter terminal of the third and fourth upper transistor is coupled to a collector terminal of the second shared lower transistor, and a base terminal of said second shared lower transistor is configured to receive the second signal.

9. The circuitry of claim 5 which further comprises:
 a fifth cascode arrangement comprising a fifth cascode input terminal configured to receive a first signal from the first input terminal, a fifth cascode output terminal and a fifth selector terminal, wherein the fifth cascode arrangement is configured to control the passage of the first signal to the fifth cascode output terminal based on a fifth selector signal received from the controller at the fifth selector terminal, and
 a sixth cascode arrangement comprising a sixth cascode input terminal configured to receive the second signal from the second input terminal, a sixth cascode output terminal and a sixth selector terminal, wherein the sixth cascode arrangement is configured to control the passage of the second signal to the sixth cascode output terminal based on a sixth selector signal received from the controller at the sixth selector terminal; and wherein
 the attenuator ladder comprises at least one second balanced pi-section resistive attenuator pad arrangement having a first and a second pad input terminal and a first and a second pad output terminal, wherein the first and second pad output terminals of the second balanced pi-section resistive attenuator pad arrangement are coupled to the first and second pad input terminals of the first balanced pi-section resistive attenuator pad arrangement; and wherein the fifth cascode output terminal and the sixth cascode output terminal are coupled to the first pad input terminal and second pad input terminal of the second balanced pi-section resistive attenuator pad arrangement respectively such that said at least one second balanced pi-section resistive attenuator pad arrangement and at least one first balanced pi-section resistive attenuator pad arrangement provides for attenuation of the first signal and the second signal to provide the differential output signal.

10. The circuitry of claim 6 wherein, an emitter terminal of the lower transistor of both the first cascode arrangement and the third cascode arrangement are coupled to a drain terminal of a first MOSFET for controlling the passing and blocking action of the first and third cascode arrangements, wherein the source terminal of said first MOSFET is configured to be coupled to a reference voltage, and the first selector signal and the third selector signal comprise the same first selector signal and the gate terminal of said first MOSFET is configured to receive said same first selector signal, and wherein an emitter terminal of the lower transistor of both the second cascode arrangement and the fourth cascode arrangement are coupled to a drain terminal of a second MOSFET for controlling the passing and blocking action of the second and fourth cascode arrangements, wherein the source terminal of said second MOSFET is configured to be coupled to a reference voltage, and the second selector signal and the fourth selector signal comprise the same second selector signal and the gate terminal of said second MOSFET is configured to receive said same second selector signal.

11. The circuitry of claim 10 wherein, a first resistor is coupled between the drain terminal of said first MOSFET and the emitter terminal of said first cascode arrangement and third cascode arrangement, and wherein a second resistor is coupled between the drain terminal of said second MOSFET and the emitter terminal of said second cascode arrangement and fourth cascode arrangement.

12. The circuitry of claim 10 wherein, the base terminal of the upper transistor of the first to fourth cascode arrangements are biased by a common bias voltage.

13. The circuitry of claim 2, wherein the first selector signal, the second selector signal, the third selector signal and the fourth selector signal output by the controller each have two levels comprising:

a first selector voltage level configured to bias the respective one of the first to fourth cascode arrangements to enable a path to the cascode output terminal, or a second selector voltage level configured to bias the respective one of the first to fourth cascode arrangements to block a path to the cascode the output terminal.

* * * * *